United States Patent
Wang

(10) Patent No.: US 9,391,006 B2
(45) Date of Patent: Jul. 12, 2016

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventor: Yazhe Wang, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/804,021

(22) Filed: Jul. 20, 2015

(65) Prior Publication Data

US 2015/0325505 A1   Nov. 12, 2015

Related U.S. Application Data

(62) Division of application No. 14/072,413, filed on Nov. 5, 2013, now Pat. No. 9,202,765.

(30) Foreign Application Priority Data

Jan. 25, 2013   (JP) .................................. 2013-012365

(51) Int. Cl.
    *H01L 21/00*   (2006.01)
    *H01L 23/495*   (2006.01)
    (Continued)

(52) U.S. Cl.
    CPC .......... *H01L 23/49541* (2013.01); *H01L 21/56* (2013.01); *H01L 23/31* (2013.01);
    (Continued)

(58) Field of Classification Search
    CPC ................... H01L 23/49555; H01L 23/49537; H01L 23/49551; H01L 23/31

USPC ......................................................... 257/773
See application file for complete search history.

(56) References Cited

U.S. PATENT DOCUMENTS 4,342,069 A   7/1982 Link
4,542,259 A   9/1985 Butt
(Continued)

FOREIGN PATENT DOCUMENTS

CN   101933139 A   12/2010
JP   63-042151 A   2/1988
(Continued)

OTHER PUBLICATIONS

An Office Action; "Notice of Reasons for Rejection," issued by the Japanese Patent Office on Mar. 29, 2016, which corresponds to Japanese Patent Application No. 2013-012365 and is related to U.S. Appl. No. 14/804,021; with English language partial translation.
(Continued)

*Primary Examiner* — Jarrett Stark
(74) *Attorney, Agent, or Firm* — Studebaker & Brackett PC

(57) ABSTRACT

A semiconductor device includes a functional block unit, external terminals and, and an external resin sealing body. The functional block unit includes an internal resin sealing body having an edge and an opposite edgeb. The edge side of the internal resin sealing body covers a first end of an internal terminal, but does not cover a second end of the internal terminal. The edge side of the internal resin sealing body covers a first end of an internal terminal, but does not cover a second end of the internal terminal. The external resin sealing body covers the root portion and a portion of the middle portion of the external terminal, but does not cover the terminal portion of the external terminal. The functional block unit and the external terminals and are integrally connected together and sealed by the external resin sealing body.

2 Claims, 11 Drawing Sheets

(51) Int. Cl.
  *H01L 23/31*  (2006.01)
  *H01L 21/56*  (2006.01)
  *H01L 23/367* (2006.01)
  *H01L 23/00*  (2006.01)
  *H01L 23/36*  (2006.01)
  *H01L 25/16*     (2006.01)

(52) U.S. Cl.
  CPC ........ *H01L23/3107* (2013.01); *H01L 23/3135* (2013.01); *H01L 23/36* (2013.01); *H01L 23/3675* (2013.01); *H01L 23/49537* (2013.01); *H01L 23/49551* (2013.01); *H01L 23/49555* (2013.01); *H01L 23/49575* (2013.01); *H01L 24/83* (2013.01); *H01L 24/85* (2013.01); *H01L 25/16* (2013.01); *H01L 2224/05599* (2013.01); *H01L 2224/32245* (2013.01); *H01L 2224/48091* (2013.01); *H01L 2224/48106* (2013.01); *H01L 2224/48245* (2013.01); *H01L 2224/73265* (2013.01); *H01L 2224/8547* (2013.01); *H01L 2224/85447* (2013.01); *H01L 2924/00014* (2013.01); *H01L 2924/1301* (2013.01); *H01L 2924/1305* (2013.01); *H01L 2924/13055* (2013.01); *H01L 2924/13091* (2013.01); *H01L 2924/181* (2013.01)

(56) References Cited

U.S. PATENT DOCUMENTS

| | | | |
|---|---|---|---|
| 4,626,960 | A | 12/1986 | Hamano et al. |
| 5,117,281 | A | 5/1992 | Katsuraoka |
| 5,172,213 | A | 12/1992 | Zimmerman |
| 5,367,196 | A | 11/1994 | Mahulikar et al. |
| 5,444,909 | A | 8/1995 | Mehr |
| 5,554,885 | A | 9/1996 | Yamasaki et al. |
| 5,835,988 | A * | 11/1998 | Ishii ............... H01L 23/3107 257/666 |
| 6,002,165 | A | 12/1999 | Kinsman |
| 6,387,732 | B1 | 5/2002 | Akram |
| 6,448,633 | B1 * | 9/2002 | Yee ............... H01L 23/3107 257/666 |
| 6,603,072 | B1 | 8/2003 | Foster et al. |
| 6,753,597 | B1 | 6/2004 | Crowley et al. |
| 6,876,066 | B2 | 4/2005 | Fee et al. |
| 6,900,530 | B1 | 5/2005 | Tsai |
| 6,951,982 | B2 | 10/2005 | Chye et al. |
| 7,829,990 | B1 * | 11/2010 | Scanlan ............ H01L 23/3107 257/686 |
| 7,847,392 | B1 | 12/2010 | Choi et al. |
| 8,067,821 | B1 * | 11/2011 | Choi ............... H01L 23/49541 257/666 |
| 8,575,756 | B2 | 11/2013 | Jang |
| 2008/0142937 | A1 | 6/2008 | Chen et al. |
| 2008/0157321 | A1 | 7/2008 | Camacho et al. |
| 2010/0295187 | A1 | 11/2010 | Tsuruoka et al. |
| 2011/0298121 | A1 | 12/2011 | Nishibori et al. |
| 2012/0098138 | A1 | 4/2012 | Oka et al. |

FOREIGN PATENT DOCUMENTS

| | | |
|---|---|---|
| JP | H05-109967 A | 4/1993 |
| JP | H07-050312 A | 2/1995 |
| JP | 2000-183281 A | 6/2000 |
| JP | 2012-089681 A | 5/2012 |

OTHER PUBLICATIONS

The First Office Action issued by the Chinese Patent Office on Apr. 5, 2016, which corresponds to Chinese Patent Application No. 201410038403.5 and is related to U.S. Appl. No. 14/804,021; with English language partial translation.

* cited by examiner

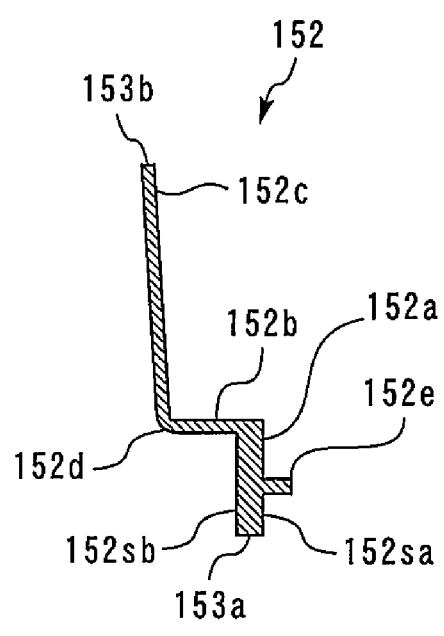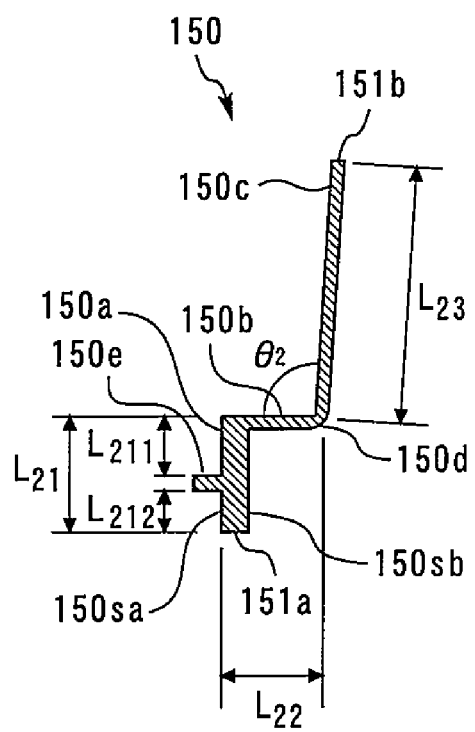

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device and a method of manufacturing a semiconductor device.

2. Background Art

Semiconductor devices having a double-resin-sealed structure formed by two shots of resin molding (primary and secondary molding), and methods of manufacturing such a semiconductor device, have been known, as disclosed, e.g., in Japanese Laid-Open Patent Publication No. S63-42151.

Further, there have also been known semiconductor devices that are configured to be compact and to allow their external terminals to be bent to the desired location above the semiconductor elements of the devices, as disclosed, e.g., in Japanese Laid-Open Patent Publication No. 2012-89681.

In the semiconductor device disclosed in this publication, cylindrical connection members are electrically connected to the semiconductor elements, and these cylindrical connection members and semiconductor elements are covered by a transfer molded resin, except for portions of the cylindrical connection members. Separate external terminals are inserted into the cylindrical connection members.

Conventional semiconductor devices are typically configured to have internal and external terminals that are integral with each other. In the manufacture of such semiconductor devices, after semiconductor chips, etc. are mounted on a lead frame and molded with a resin, the leads of the lead frame, which eventually serve as terminals, are cut and bent or shaped to produce individual semiconductor devices. In this case, however, the freedom in designing or selecting the configurations of the terminals is limited by manufacturing restrictions associated with the lead frame and the molding die.

In the case of the semiconductor device disclosed in the above Patent Publication No. 2012-89681, its external terminals are separate components and connected to the cylindrical connection members of the semiconductor device after the semiconductor elements, etc. are transfer molded with a resin. This provides increased freedom in selecting the configurations of the external terminals. However, this technique requires that the external terminals of the semiconductor device be located above the semiconductor elements and extend upward to ensure insulation of the external terminals. In order to achieve this, the external terminals are inserted into the cylindrical connection members of the semiconductor device, which are exposed at the top surface of the molded resin. Thus, this semiconductor device must be provided with some connection members (such as the cylindrical connection members described above), and the external terminals of the semiconductor device must project from the top surface of the semiconductor device, thus limiting the configuration, location, and orientation of the external terminals. Therefore, there is still room for improvement in the configuration of the semiconductor device in order to provide greater freedom in selecting the configurations of the external terminals.

SUMMARY OF THE INVENTION

The present invention has been made to solve the above problems. It is, therefore, an object of the present invention to provide a semiconductor device configured to provide great freedom in designing the configuration of its external terminals. Another object of the invention is to provide a method of manufacturing such a semiconductor device.

According to one aspect of the present invention, a semiconductor device includes: a functional block unit, at least one external terminal, and an external resin sealing body.

The functional block unit includes a semiconductor element, at least one internal terminal having a first end and a second end and electrically connected to the semiconductor element, and an internal resin sealing body covering the semiconductor element and the first end of the at least one internal terminal but not covering the second end of the at least one internal terminal.

The at least one external terminal has a third end connected to the second end of the at least one internal terminal, and a fourth end.

The external resin sealing body covers the second end of the at least one internal terminal and the third end of the at least one external terminal, but not covers the fourth end of the at least one external terminal.

According to another aspect of the present invention, a method of manufacturing a semiconductor device, includes: a functional block preparation step, an external terminal preparation step, a connection step and an external resin sealing step.

The functional block preparation step prepares a functional block unit, wherein the functional block unit includes a semiconductor element, at least one internal terminal having a first end and a second end and electrically connected to the semiconductor element, and an internal resin sealing body covering the semiconductor element and the first end of the at least one internal terminal but not covering the second end of the at least one internal terminal.

The external terminal preparation step prepares an external terminal having a third end and a fourth end.

The connection step connects the third end of the external terminal to the second end of the at least one internal terminal.

The external resin sealing step covers, after the connection step, the second end of the at least one internal terminal and the third end of the external terminal with a resin, but not covering the fourth end of the external terminal.

Other and further objects, features and advantages of the invention will appear more fully from the following description.

BRIEF DESCRIPTION OF THE DRAWINGS

FIG. 14A and FIG. 14B are diagrams showing the configurations of the external terminals of the second embodiment.

DETAILED DESCRIPTION OF THE PREFERRED EMBODIMENTS

First Embodiment

Configuration of Device of First Embodiment

Figure 1:
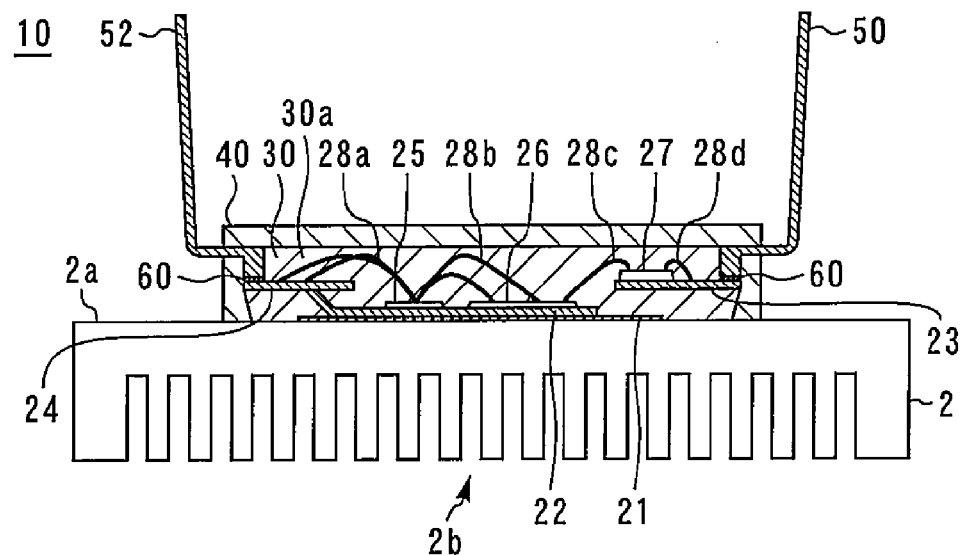
FIG. 1 is a cross-sectional view showing the configuration of a semiconductor device in accordance with a first embodiment of the present invention.
Figure 2:
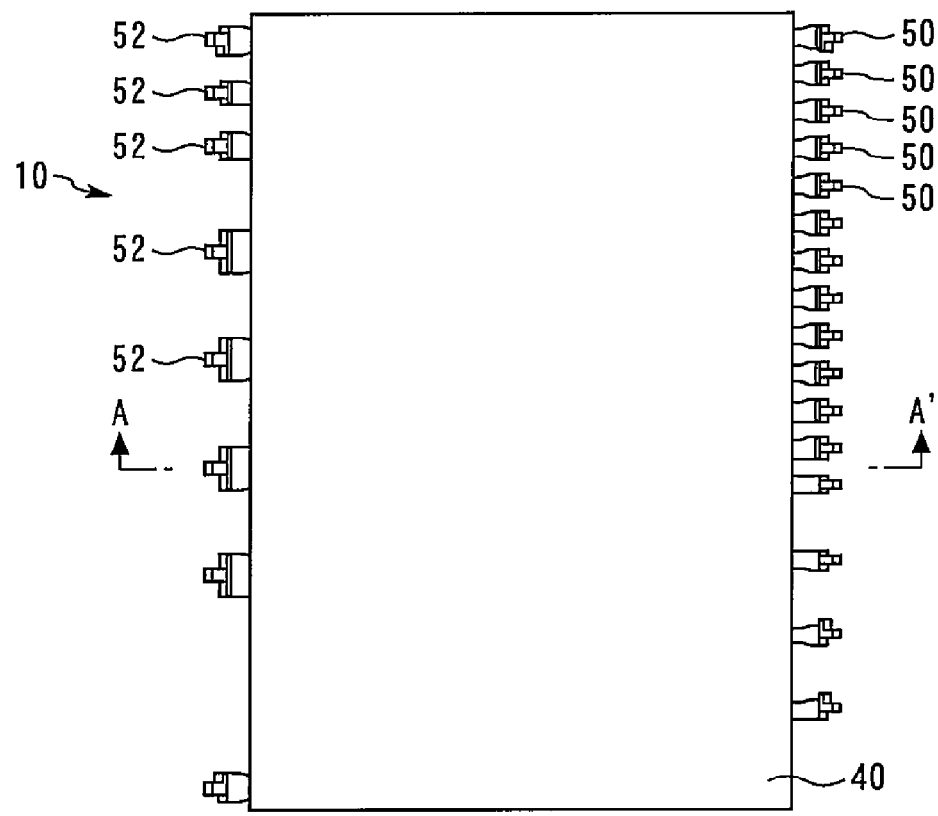
FIG. 2 is a plan view of the semiconductor device of the first embodiment.

FIG. 1 is a cross-sectional view showing the configuration of a semiconductor device 10 in accordance with a first embodiment of the present invention. FIG. 2 is a plan view of the semiconductor device 10 of the first embodiment. Specifically, FIG. 1 is a cross-sectional view of the semiconductor device 10 taken along line A-A' of FIG. 2 and viewed in the direction of the arrows. FIGS. 3 to 6 are diagrams showing the manufacturing process of the semiconductor device 10 of the first embodiment.

The semiconductor device 10 of the first embodiment includes a functional block unit 30, external terminals 50, external terminals 52, and an external resin sealing body 40. Further, a heat sink 2 is attached to the lower surface 32 of the functional block unit 30. As shown in FIGS. 3 to 6, in the manufacture of the semiconductor device 10, the functional block unit 30 and the external terminals 50 and 52 are integrally connected together and sealed using a resin, which forms the external resin sealing body 40.

The functional block unit 30 includes internal components, such as semiconductor elements, and an internal resin sealing body 30a. Specifically, these internal components are transfer molded with a resin, which forms the internal resin sealing body 30a. The internal components include an insulating sheet 21, a die pad 22, internal terminals 23, internal terminals 24, semiconductor elements 25 and 26, control ICs 27, and wires 28a, 28b, 28c and 28d. The semiconductor elements 25 and 26 are die bonded to the top surface of the die pad 22. The insulating sheet 21, which has high thermal conductivity, is disposed on the bottom surface of the die pad 22. The heat sink 2 is attached to the lower surface 32 side of the functional block unit 30. The heat sink 2 has a mounting surface 2a and a fin structure 2b.

The semiconductor elements 26 are semiconductor chips having an insulated gate bipolar transistor (IGBT) formed thereon and function as switching elements. It should be noted, however, that the present invention is not limited to IGBTs, but rather, the semiconductor elements 26 may be other suitable power semiconductor elements such as MOSFETs. The semiconductor elements 25 are semiconductor chips having a free wheel diode (FWD) formed thereon. The semiconductor elements 25 and 26 are electrically connected together by a plurality of wires 28b. The control ICs 27 have a function to drive the semiconductor elements 26 (IGBTs) and protect the semiconductor device 10.

As shown in the plan view of FIG. 2, the semiconductor device 10 has a rectangular configuration and relatively large top and bottom surfaces. The external terminals 50 are provided in a row on one longitudinal side of the semiconductor device 10, and the external terminals 52 are provided in a row on the other longitudinal side. That is, the semiconductor device 10 is an intelligent power module (IPM) encapsulated in a so-called DIP package. A dual in-line package (DIP) is an IC chip package with a rectangular housing having two rows of external input/output terminals provided on the opposing longitudinal sides of the housing.

Though the cross-sectional view of FIG. 1 only shows one semiconductor element 25, one semiconductor element 26, and one control IC 27, the functional block unit 30 has a configuration including a plurality of semiconductor elements 25 and a plurality of semiconductor elements 26, which is typical of an IPM. Specifically, the functional block unit 30 includes 6 sets of semiconductor elements 25 and 26.

Although the electrical circuit of the functional block unit 30 is not shown, each set of semiconductor elements 25 and 26 is connected to another set to form an arm circuit. Thus, the functional block unit 30 includes three arm circuits, which are connected to form a three-phase AC inverter. Further, though not shown, there are a plurality of control ICs 27 arranged parallel to the bottom surface of the semiconductor device 10. Specifically, the functional block unit 30 includes two control ICs 27, one of which is a high voltage IC (HVIC) for controlling the turning on and off of the switching elements in the upper arms, and the other of which is a low voltage IC (LVIC) for controlling the turning on and off of the switching elements in the lower arms. Alternatively, the functional block unit 30 may include three HVICs and one LVIC.

The internal terminals 23 have a first end 23a and a second end 23b. An electrode of each control IC 27 is electrically connected to the control terminal (or IGBT gate terminal) of a respective semiconductor element(s) 26 by a respective wire 28c. Each internal terminal 23 is electrically connected to a respective electrode of a respective control IC 27 by a respective wire 28d. Further, the internal terminals 24 have a first end 24a and a second end 24b, and each internal terminal 24 is electrically connected to a respective semiconductor element 25 by a respective wire 28a.

The internal resin sealing body 30a has an upper surface 31 and an opposite lower surface 32 and also has an edge 33a and an edge 33b extending between the upper surface 31 and the lower surface 32. The internal resin sealing body 30a covers the semiconductor elements 25 and 26 and the control ICs 27. Further, the edge 33a side of the internal resin sealing body 30a covers the first end 23a of each internal terminal 23, but does not cover the second end 23b of the internal terminal 23; that is, the second end 23b of each internal terminal 23 is exposed at the edge 33a of the internal resin sealing body 30a. Further, the edge 33b side of the internal resin sealing body 30a covers the first end 24a of each internal terminal 24, but does not cover the second end 24b of the internal terminal 24; that is, the second end 24b of each internal terminal 24 is exposed at the edge 33b of the internal resin sealing body 30a.

The external terminals 50 have a third end 51a and a fourth end 51b. The third end 51a of each external terminal 50 is connected to the second end 23b of a respective internal terminal 23 by solder 60. The external terminals 52 have a third end 53a and a fourth end 53b. The third end 53a of each external terminal 52 is connected to the second end 24b of a respective internal terminal 24 by solder 60.

Figure 3:
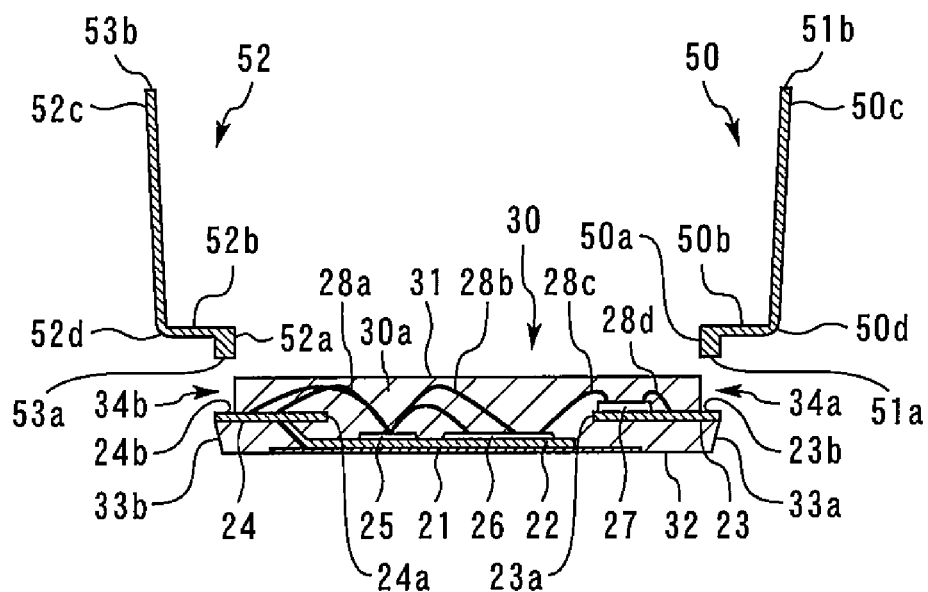
FIGS. 3 to 6 are diagrams showing the manufacturing process of the semiconductor device of the first embodiment.

The external resin sealing body 40 covers the second end 23b of each internal terminal 23, the second end 24b of each internal terminal 24, the third end 51a side of each external terminal 50, and the third end 53a side of each external terminal 52. However, the external resin sealing body 40 does not cover the fourth end 51b side of each external terminals 50 and the fourth end 53b side of each external terminals 52; they project outwardly from the external resin sealing body 40, as shown in FIG. 1. FIG. 3 is a cross-sectional view showing the functional block unit 30 and the external terminals 50 and 52 before they are integrally connected together.

In the present embodiment, the external terminals 50 and 52 and the internal terminals 23 and 24 are made of copper (Cu).

In the present embodiment, since the functional block unit 30 and the external terminals 50 and 52 are separately produced and then connected and packaged together using the external resin sealing body 40, there is great freedom in designing the configuration of the external terminals 50 and 52. Further, the internal resin sealing body 30a is a transfer molded resin member. Therefore, the internal resin sealing body 30a has the effect of improving the insulation and reliability of internal components of the semiconductor device 10, such as the semiconductor elements 25 and 26 and the internal terminals 23 and 24.

The internal resin sealing body 30a forms the exterior surfaces of the functional block unit 30; that is, the upper and lower surfaces 31 and 32 of the internal resin sealing body 30a form the upper and lower surfaces of the functional block unit 30, and the edges 33a and 33b of the internal resin sealing body 30a form two sides of the functional block unit 30.

Figure 8A:
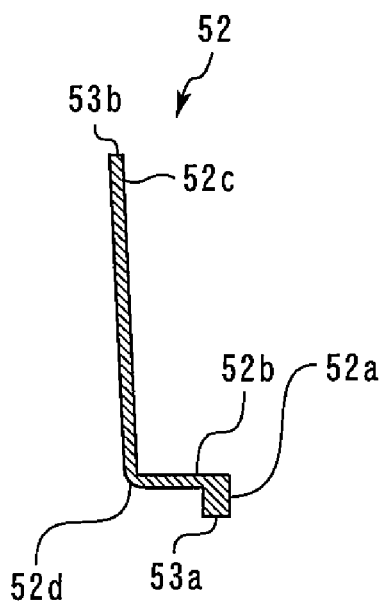
FIG. 8A and FIG. 8B are diagrams showing the configurations of the external terminals of the first embodiment.
Figure 8B:
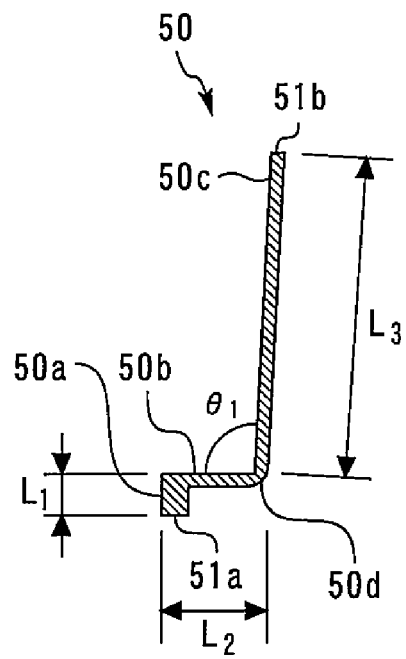

FIG. 8A and FIG. 8B are diagrams showing the configurations of the external terminals 50 and 52 of the first embodiment. Each external terminal 50 has a root portion 50a, a middle portion 50b, a bent portion 50d, and a terminal portion 50c which are integrally connected with one another, and also has a third end 51a and a fourth end 51b (as described above). Specifically, as shown in FIG. 1, the root portion 50a extends a length L1 from the third end 51a (which is connected to the second end 23b of one of the internal terminals 23) in an upward direction perpendicular to the upper surface 31 of the internal resin sealing body 30a. The middle portion 50b extends a length L2 perpendicularly from the root portion 50a, in a direction outwardly away from the edge 33a of the internal resin sealing body 30a. The terminal portion 50c extends a length L3 from the bent portion 50d in an upward direction at an angle θ1 relative to the middle portion 50b, where in the present embodiment, θ1>90 degrees. It should be noted that the leading end of the terminal portion 50c forms the fourth end 51b of the external terminal 50.

Each external terminal 52 has a root portion 52a, a middle portion 52b, a bent portion 52d, and a terminal portion 52c which are integrally connected with one another, and also has a third end 53a and a fourth end 53b (as described above). Specifically, the root portion 52a extends from the third end 53a (which is connected to the second end 24b of one of the internal terminals 24) in an upward direction perpendicular to the upper surface 31 of the internal resin sealing body 30a. The middle portion 52b extends perpendicularly from the root portion 52a, in a direction outwardly away from the edge 33b of the internal resin sealing body 30a. The terminal portion 52c extends from the bent portion 52d in an upward direction. The leading end of the terminal portion 52c forms the fourth end 53b of the external terminal 52.

It should be noted that the external terminals 50 and 52 have the same configuration, as viewed, e.g., in the cross-section of FIG. 1, and are arranged in a mirror symmetrical relationship, as shown, e.g., in FIG. 1. The external resin sealing body 40 completely covers the root portion 50a of each external terminal 50 and the root portion 52a of each external terminal 52 and partially covers the middle portion 50b of each external terminal 50 and the middle portion 52b of each external terminal 52; the external resin sealing body 40 does not cover the terminal portion 50c and a portion of the middle portion 50b of each external terminal 50 and the terminal portion 52c and a portion of the middle portion 52b of each external terminal 52.

Figure 6:
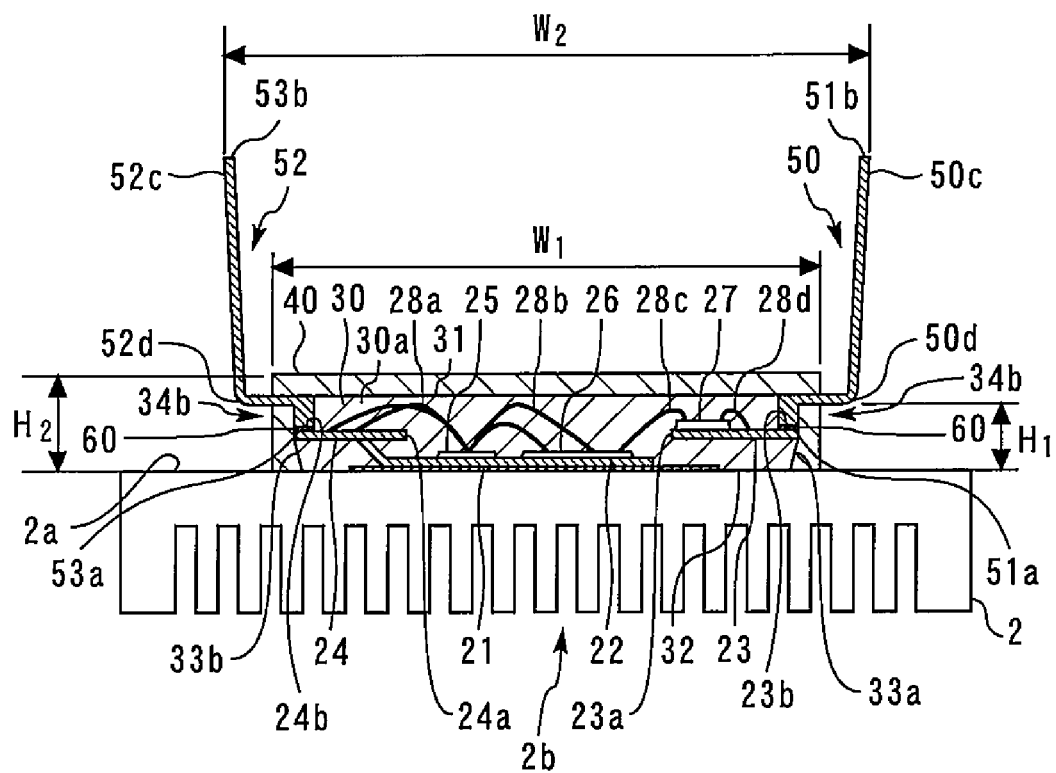

Referring to FIG. 6, when the heat sink 2 is attached to the lower surface 32 of the functional block unit 30, the distance between the heat sink 2 and the exposed middle portion of each external terminal is relatively large (this distance being referred to herein as the insulating spatial distance H1), because of the configuration of the external terminal. As a result, the thickness (or height dimension) H2 and the width W1 of the external resin sealing body 40 (or the resin packing member) need not be as large as would be required if the external terminal has a straight configuration. Further, the distance W2 between the fourth end 51b of each external terminal 50 and the fourth end 53b of a respective external terminal 52 can be varied simply by varying the angle θ1 between the middle portion and the terminal portion of these external terminals.

As described above, the second end 23b of each internal terminal 23 and the second end 24b of each internal terminal 24 are exposed at the edge 33a and the edge 33b, respectively, of the internal resin sealing body 30a. It should be noted, however, that the present invention is not limited to this particular configuration. The second end of each internal terminal 23, 24 may be partially exposed at the upper surface 31 or lower surface 32 of the internal resin sealing body 30a, e.g., by forming openings in the internal resin sealing body 30a.

The internal terminals 23 and 24 are plate-like members and are partially exposed at the edges 33a and 33b of the internal resin sealing body 30a (as described above). Therefore, the internal terminals 23 and 24 may have a simple construction, and the internal components of the functional block unit 30 may be sealed or encapsulated by a conventional resin sealing process using a commonly used resin sealing die of the type which is used to form a package with inner leads projecting from sides thereof.

In the present embodiment, the external terminals 50 and 52 are connected to the internal terminals 23 and 24, respectively, by solder 60. This ensures good mechanical and electrical contact between the internal and external terminals, as compared to semiconductor devices of the type disclosed in the above Japanese Laid-Open Patent Publication No. 2012-089618 in which the external terminals are connected into cylindrical connection members (serving as internal terminals). However, the present invention is not limited to soldering, but other suitable connection methods may be used, such as bonding using a conductive adhesive, threading, riveting, hooking, and press-fitting, etc.

It should be noted that the edge 33a and the edge 33b of the internal resin sealing body 30a have a step 34a and a step 34b, respectively (see, e.g., FIG. 3). Therefore, each edge 33a, 33b has an upper vertical face and a lower vertical face, as shown, e.g., in FIG. 3. The second end 23b of each internal terminal 23 projects from the upper vertical face of the edge 33a of the internal resin sealing body 30a and extends over the step 34a. The leading edge of each internal terminal 23 and the lower vertical face of the edge 33a of the internal resin sealing body 30a form a substantially flat surface. Likewise, the second end 24b of each internal terminal 24 projects from the upper vertical face of the edge 33b of the internal resin sealing body 30a and extends over the step 34b. The leading edge of each internal terminal 24 and the lower vertical face of the edge 33b of the internal resin sealing body 30a form a substantially flat surface. The external resin sealing body 40 is formed in such a manner as to cover the exposed top surfaces and edges of the internal terminals 23 and 24.

As described above, the semiconductor device 10 is configured as a DIP package. Therefore, the functional block unit 30 has a plate-like shape and has the two opposing longitudinal edges 33a and 33b. The internal terminals 23 are disposed in a row on the edge 33a side of the functional block unit 30 and form a first group of internal terminals. The internal terminals 24 are disposed in a row on the edge 33b side of the functional block unit 30 and form a second group of internal terminals.

The second end 23b of each internal terminal 23 of the first group of internal terminals is exposed at the edge 33a of the functional block unit 30, and the second end 24b of each internal terminal 24 of the second group of internal terminals is exposed at the edge 33b.

Each external terminal 50 is connected to a respective internal terminal 23 by bonding the first end 51a of the external terminal 50 to the second end 23b of the internal terminal 23 by means of solder 60 in such a manner that the root portion 50a of the external terminal 50 is in contact with the upper vertical face of the edge 33a of the internal resin sealing body 30a (or the functional block unit 30). Likewise, each external terminal 52 is connected to a respective internal terminal 24 by bonding the first end 53a of the external terminal 52 to the second end 24b of the internal terminal 24 by means of solder 60 in such a manner that the root portion 52a of the external terminal 52 is in contact with the upper vertical face of the edge 33b of the internal resin sealing body 30a. This means that there is great freedom in designing the configurations of the external terminals 50 and 52 and the entire package. Further, it is easy to adjust the insulating spatial distance H1 between the heat sink 2 and the exposed middle portion of each external terminal in accordance with product specifications. Thus, the present embodiment provides an improved novel semiconductor device.

It should be noted that the external terminals 50 and 52 may be made of a different material than the internal terminals 23 and 24. Specifically, the material of the external terminals 50 and 52 may be selected without regard to the material of the internal terminals 23 and 24, and vice versa, for various reasons concerning, e.g., productivity, cost, or use environment. For example, the internal terminals 23 and 24 may be made of copper (Cu) and the external terminals 50 and 52 may be made of aluminum (Al), which is relatively inexpensive, resulting in decreased cost of the semiconductor device 10. Further, some of the external terminals 50 and 52 may be made of a different metal material than the internal terminals 23 and 24.

Manufacturing Method of First Embodiment

Figure 7:
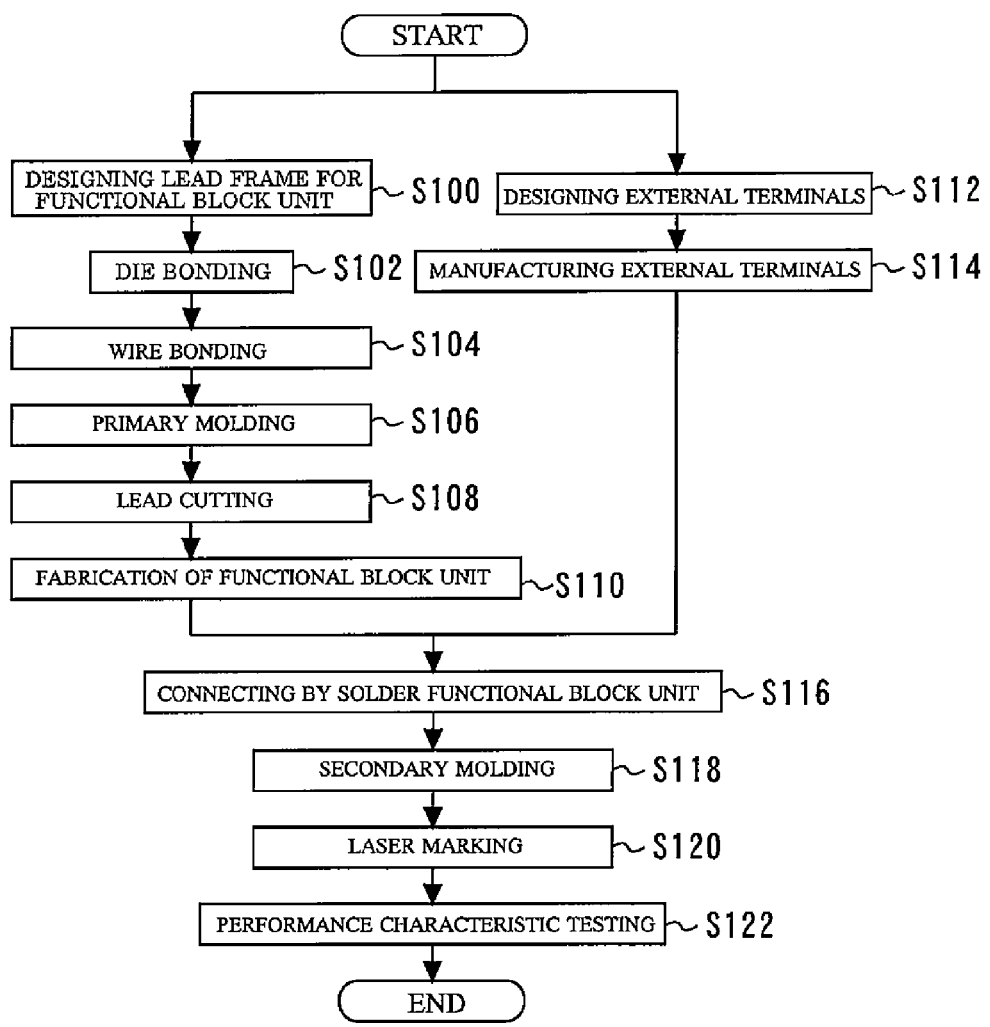
FIG. 7 is a flowchart of the manufacturing process of the semiconductor device, illustrating the method of manufacturing a semiconductor device in accordance with the first embodiment.

FIG. 7 is a flowchart of the manufacturing process of the semiconductor device 10, illustrating the method of manufacturing a semiconductor device in accordance with the first embodiment.

(Functional Block Unit Preparation Process) S100-S110

Referring to the flowchart of FIG. 7, the manufacturing process begins by designing the lead frame (or simply, frame) for the functional block unit 30 (Step S100). Specifically, in this step, the internal layout of the functional block unit 30 including the die pad 22, the internal terminals 23 and 24, etc. is designed, and the lead frame for the functional block unit 30 is then designed to achieve the layout. This lead frame includes the die pad 22 and the internal terminals 23 and 24 integrally formed with each other. It should be noted that the leads of the lead frame are later cut from the frame portion of the lead frame in a lead cutting step.

Next, the semiconductor elements 25 and 26 and the control ICs 27 are die bonded to the lead frame (Step S102).

The wires 28a to 28d are then wire bonded so as to electrically connect the semiconductor elements 25 and 26, the control ICs 27, and the internal terminals 23 and 24 (Step S104).

A first or primary molding step is then performed (Step S106). In this step, the components on the lead frame are sealed or encapsulated with a resin using a molding die, as in a general transfer molding step, thereby forming the internal resin sealing body 30a.

Next, a lead cutting step is performed (Step S108). In this step, the molded lead frame portion (or the internal resin sealing body 30a) having the die pad 22 and the internal terminals 23 and 24 is removed from the lead frame by lead cutting.

This completes the fabrication of the functional block unit 30 (Step S110).

(External Terminal Preparation Process) S112, S114

As described above, the semiconductor device 10 of the present embodiment is configured such that the functional block unit 30 and the external terminals 50 and 52 can be designed separately from each other.

Therefore, the external terminals are designed in a step (Step S112) which is independent of Steps S100-S110. Specifically, the external terminals 50 and 52 are designed such that the completed semiconductor device 10 will have desired dimensions (e.g., the insulating spatial distance H1 between the heat sink 2 and the exposed middle portion of each external terminal, the height H2 and the width W1 of the external resin sealing body 40, and the distance W2 between the fourth end 51b of each external terminal 50 and the fourth end 53b of a respective external terminal 52 shown in FIG. 6).

Next, the external terminals 50 and 52 are manufactured as designed in Step S112 (Step S114). In this external terminal manufacturing step of the present embodiment, the external terminals 50 and 52 are manufactured by punching so as to eliminate the need to later bend the tip of each external terminal into the desired shape in a lead forming or shaping step (or bending step). (It should be noted that external terminals integral with a lead frame are typically bent into the desired shape in a lead forming step.) It is to be understood, however, the present invention is not limited to punching, but other suitable manufacturing methods such as etching and bending may be used.

(Connection Process)

Figure 4:
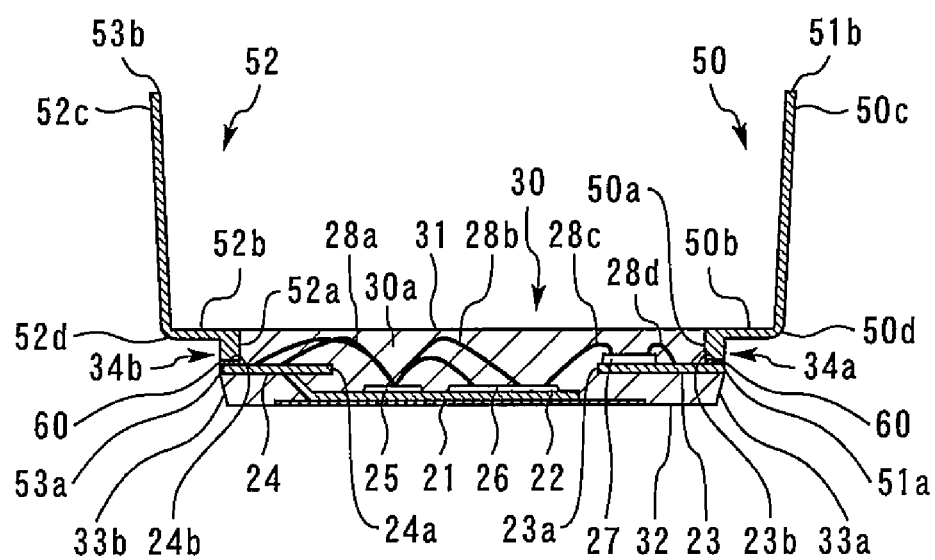
Figure 5:
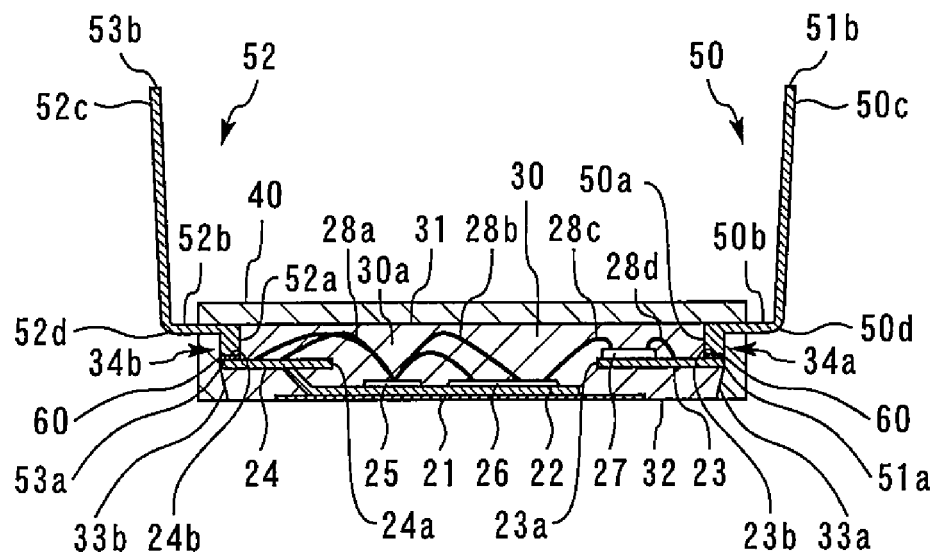

Next, a connection step is performed to bond the third end 51a of each external terminal 50 to the second end 23b of a respective internal terminal 23 and to bond the third end 53a of each external terminal 52 to the second end 24b of a respective internal terminal 24 using solder 60 (Step S116). FIGS. 3 and 4 show this connection step. In this step, the external terminals 50 and 52 are preferably soldered to the functional block unit 30 at once using a jig.

(Second Molding)

After the connection step, a second or secondary molding step (or external resin sealing step) is performed (Step S118). In this step, the external resin sealing body 40 is formed, which covers the exposed portion of the second end 23b of each internal terminal 23, the exposed portion of the second end 24b of each internal terminal 24, the third end 51a side of each external terminal 50, and the third end 53a side of each external terminal 52. It should be noted that the external resin sealing body 40 does not cover the fourth end 51b side of each external terminal 50 and the fourth end 53b side of each external terminal 52. This step may be accomplished using a dedicated molding die.

Laser marking (Step S120) and performance characteristic testing (Step S122) are then performed, thereby completing the manufacture of the semiconductor device 10.

In the manufacturing method of the present embodiment described above, the functional block unit 30 and the external terminals 50 and 52 are designed and manufactured separately from each other. This results in increased freedom in designing the configurations of the functional block unit 30 and the external terminals 50 and 52.

Further, it is possible to select the lengths (L1, L2, L3) of the root portion 50a, the middle portion 50b, and the terminal portion 50c of each external terminal 50 and the lengths of the root portion 52a, the middle portion 52b, and the terminal portion 52c of each external terminal 52 without regard to the configuration of the functional block unit 30. Further, the insulating spatial distance H1 between the heat sink 2 and the exposed middle portion of each external terminal can be easily adjusted by changing the length L1 of the root portion of the external terminal.

Second Embodiment

Figure 9:
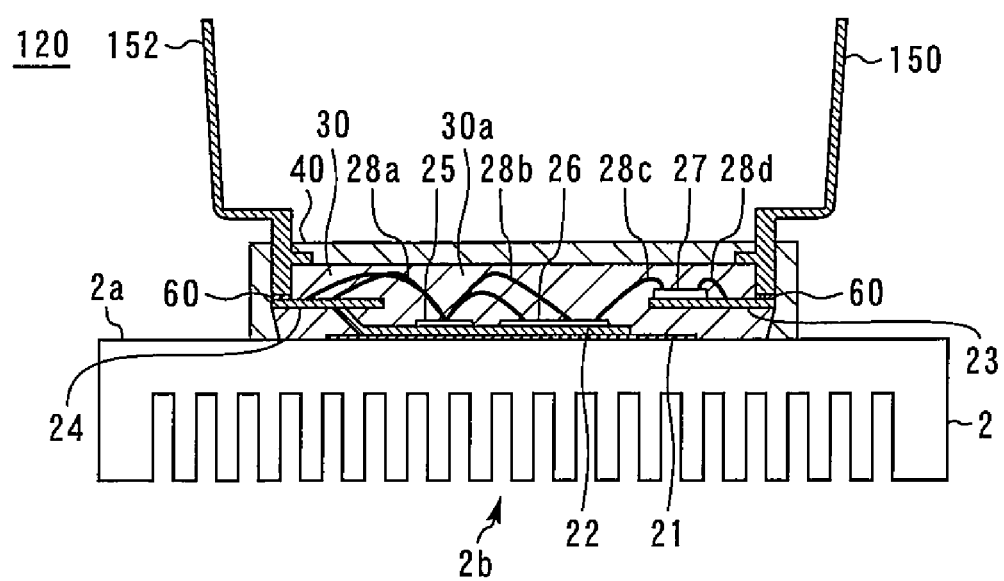
FIG. 9 is a cross-sectional view showing the configuration of a semiconductor device in accordance with a second embodiment of the present invention.
Figure 10:
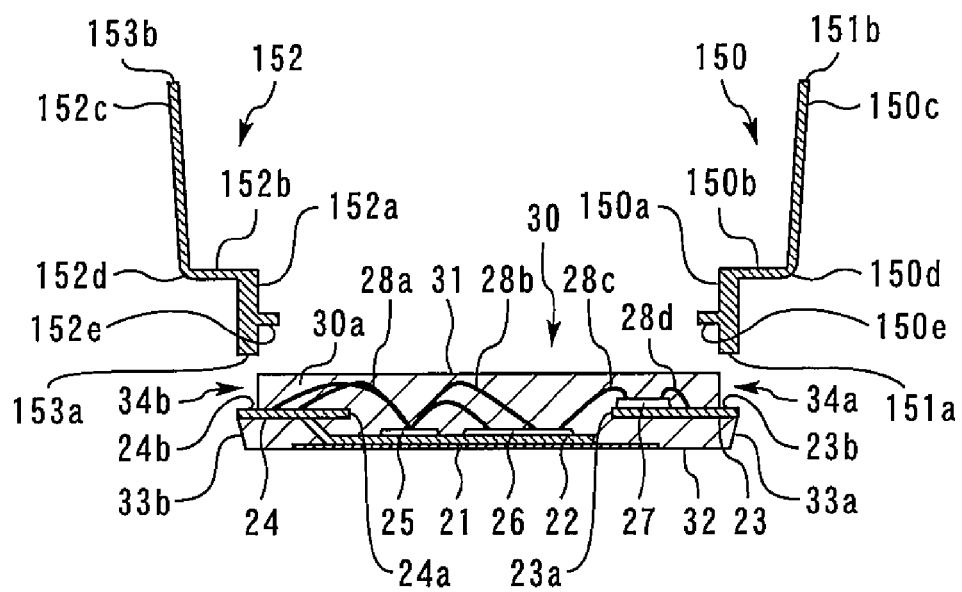
FIGS. 10 to 13 are diagrams showing the manufacturing process of the semiconductor device of the second embodiment.

FIG. 9 is a cross-sectional view showing the configuration of a semiconductor device 120 in accordance with a second embodiment of the present invention. It should be noted that the plan configuration of the semiconductor terminals 120 is similar to that shown in FIG. 2, except for the shapes of the external terminals. FIGS. 10 to 13 are diagrams showing the manufacturing process of the semiconductor device 120 of the second embodiment.

The semiconductor device 120 of the second embodiment is similar to the semiconductor device 10 of the first embodiment in that it has the functional block unit 30 and the external resin sealing body 40. However, the semiconductor device 120 differs from the semiconductor device 10 in that the external terminals 50 and 52 are replaced by the external terminals 150 and 152.

As shown in FIGS. 10 to 13, in the manufacture of the semiconductor device 120, the functional block unit 30 and the external terminals 150 and 152 are integrally connected together and sealed using a resin, which forms the external resin sealing body 40. It should be noted that the method of manufacturing the semiconductor device 120 in accordance with the second embodiment is similar to the manufacturing method of the first embodiment illustrated in FIG. 7.

FIG. 14A and FIG. 14B are diagrams showing the configurations of the external terminals 150 and 152 of the second embodiment. As can be seen from FIG. 14A, FIG. 14B and FIG. 9, each external terminal 150 has a root portion 150a, a middle portion 150b, a bent portion 150d, and a terminal portion 150c which are integrally connected with one another, and also has a third end 151a and a fourth end 151b. Specifically, the root portion 150a extends a length L21 from the third end 151a (which is connected to the second end 23b of one of the internal terminals 23) in an upward direction perpendicular to the upper surface 31 of the internal resin sealing body 30a. The middle portion 150b extends a length L22 perpendicularly from the root portion 150a, in a direction outwardly away from the edge 33a of the internal resin sealing body 30a. The terminal portion 150c extends a length L23 from the bent portion 150d in an upward direction at an angle θ2 relative to the middle portion 150b. It should be noted that the leading end of the terminal portion 150c forms the fourth end 151b of the external terminal 150.

The root portion 150a has a first surface 150sa facing toward the internal resin sealing body 30a, and a second surface 150sb opposite the first surface 150sa. The root portion 150a has a projection 150e extending from the first surface 150sa. The projection 150e is located a distance L212 vertically above the third end 151a (or, in other words, located a distance L211 vertically below the top surface of the middle portion 150b).

Figure 11:
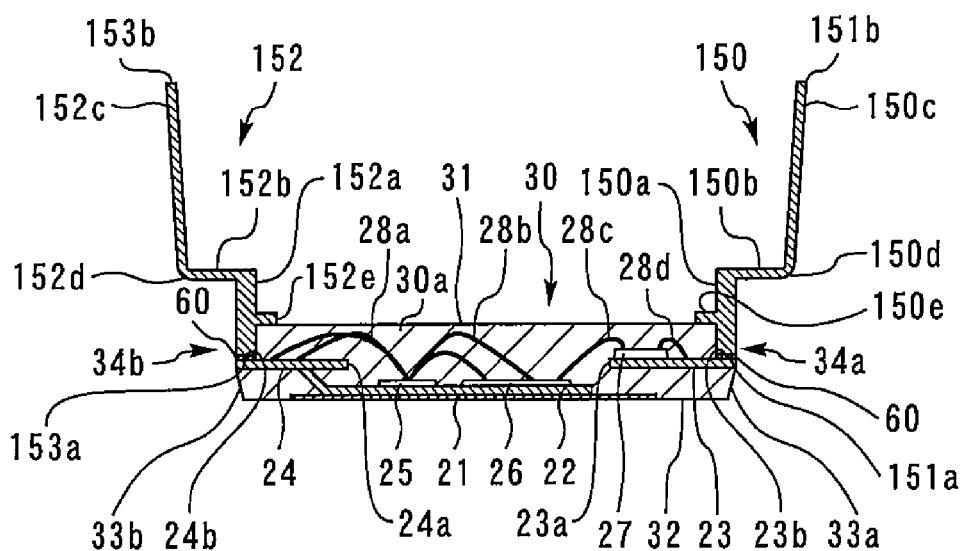
Figure 12:
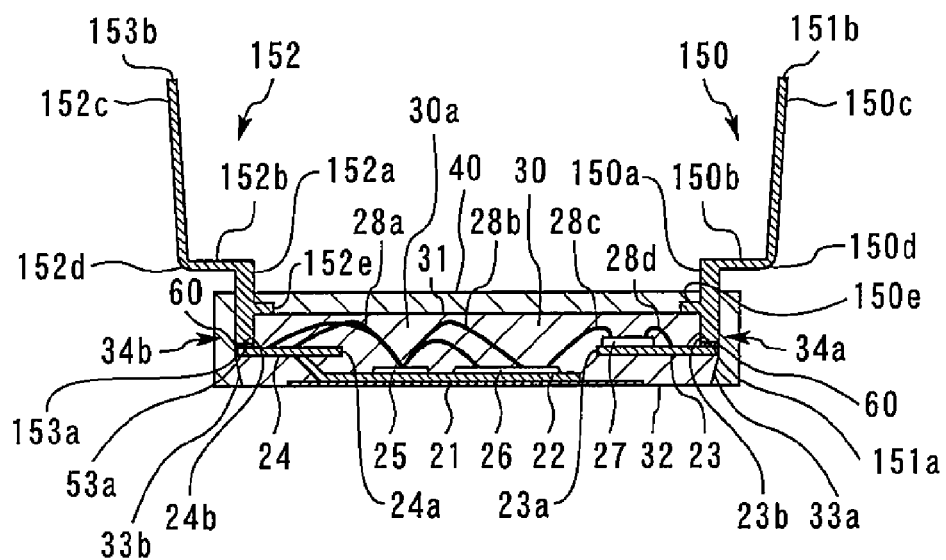

The above distance L212 is equal to the vertical dimension of the upper vertical face of the edge 33a of the internal resin sealing body 30a, which face extends perpendicularly from the surface of the step 34a of the edge 33a. As shown in FIGS. 9 and 11, the first surface 150sa of the root portion 150a is in contact with the upper vertical face of the edge 33a of the internal resin sealing body 30a, and the projection 150e of the root portion 150a is in contact with the upper surface 31 of the internal resin sealing body 30a. Thus, the projection 150e serves to position the external terminal, as well as preventing its tilting.

Like each external terminal 150, each external terminal 152 has a root portion 152a, a middle portion 152b, a bent portion 152d, and a terminal portion 152c which are integrally connected with one another, and also has a third end 153a and a fourth end 153b, as shown in FIG. 14A and FIG. 14B. Specifically, the root portion 152a extends from the third end 153a (which is connected to the second end 24b of one of the internal terminals 24) in an upward direction perpendicular to the upper surface 31 of the internal resin sealing body 30a. The middle portion 152b extends perpendicularly from the root portion 152a, in a direction outwardly away from the edge 33b of the internal resin sealing body 30a. The terminal portion 152c extends from the bent portion 152d in an upward direction. The leading end of the terminal portion 152c forms the fourth end 153b of the external terminal. It should be noted that the external terminals 150 and 152 have the same configuration, as viewed, e.g., in the cross-section of FIG. 9, and are arranged on the opposing longitudinal sides of the functional block unit 30 in a mirror symmetrical relationship.

The root portion 152a has a first surface 152sa facing toward the internal resin sealing body 30a, and a second surface 152sb opposite the first surface 152sa. The root portion 152a has a projection 152e extending from the first surface 152sa. The root portion 152a has a similar configuration to the root portion 150a. Specifically, the distance between the projection 152e and the third end 153a of the external terminal 152 is equal to the distance L212 between the projection 150e and the third end 151a of the external terminal 150, and the distance between the projection 152e and the top surface of the middle portion 152b of the external terminal 152 is equal to the distance L211 between the projection 150e and the top surface of the middle portion 150b of the external terminal 150. As shown in FIGS. 9 and 11, the first surface 152sa of the root portion 152a is in contact with the upper vertical face of the edge 33b of the internal resin sealing body 30a, and the projection 152e of the root portion 152a is in contact with the upper surface 31 of the internal resin sealing body 30a.

The external resin sealing body 40 completely covers the root portion 150a of each external terminal 150 and the root portion 152a of each external terminal 152 and partially covers the middle portion 150b of each external terminal 150 and the middle portion 152b of each external terminal 152; the external resin sealing body 40 does not cover the terminal portion 150c and a portion of the middle portion 150b of each external terminal 150 and the terminal portion 152c and a portion of the middle portion 152b of each external terminal 152.

Figure 13:
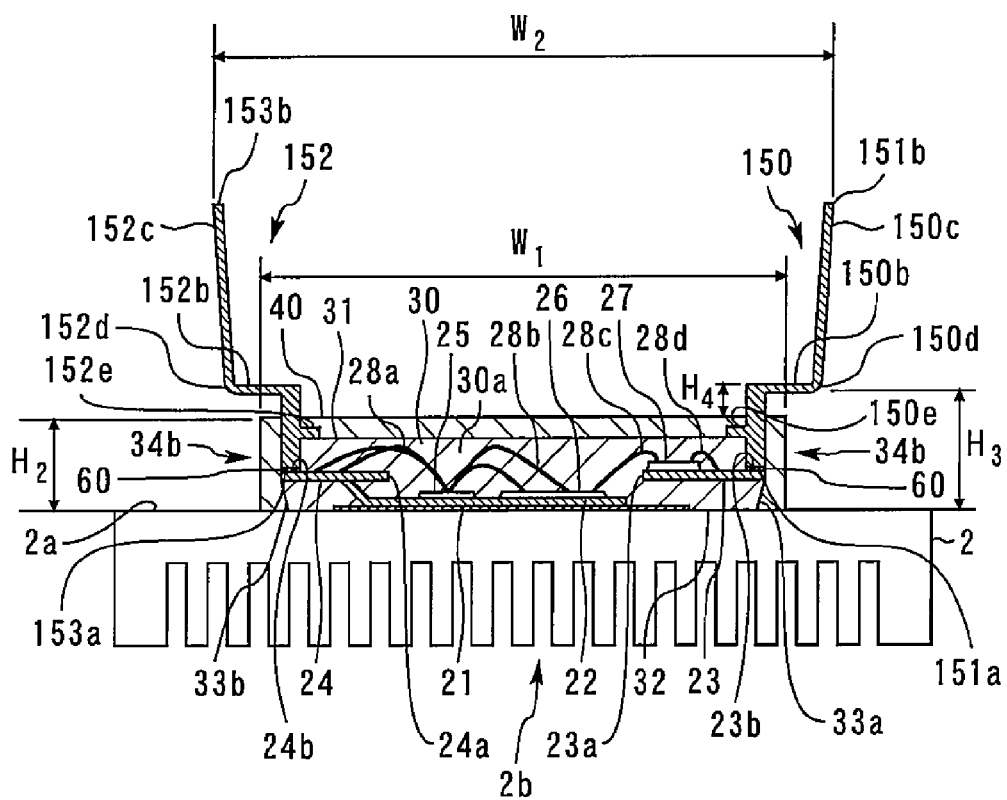

As shown in FIG. 13, in the semiconductor device 120, the root portion 150a of each external terminal 150 and the root portion 152a of each external terminal 152 project a substantial distance H4 upward from the external resin sealing body 40. This configuration makes it possible to increase the insulating spatial distance H3 between the heat sink 2 and the exposed middle portion of each external terminal while minimizing the width W1 of the package (or the external resin sealing body 40).

A conventional method for increasing the insulating spatial distance between the heat sink 2 and the exposed middle portion of each external terminal is to form a recess or groove in the peripheral portion of the heat sink 2 so that the portion of the mounting surface 2a of the heat sink 2 facing each external terminal is lower than the central portion of the mounting surface 2a which is in contact with the lower surface 32 of the functional block unit 30. In the present embodiment, on the other hand, the insulating spatial distance between the heat sink 2 and the exposed middle portion of each external terminal may be adjusted to the desired distance by changing the length (L21) of the root portions 150a and 152a of the external terminals 150 and 152, respectively, eliminating the need to form a recess such as described above.

Third Embodiment

Figure 15:
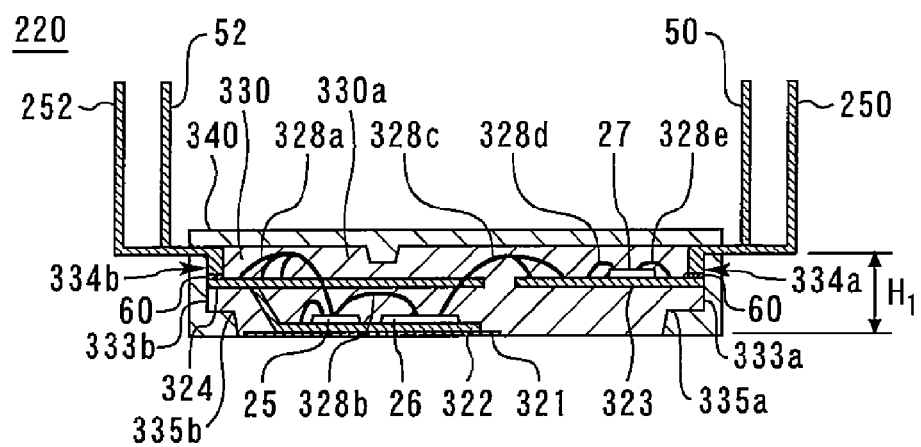
FIG. 15 is a cross-sectional view showing the configuration of a semiconductor device in accordance with a third embodiment of the present invention.
Figure 16:
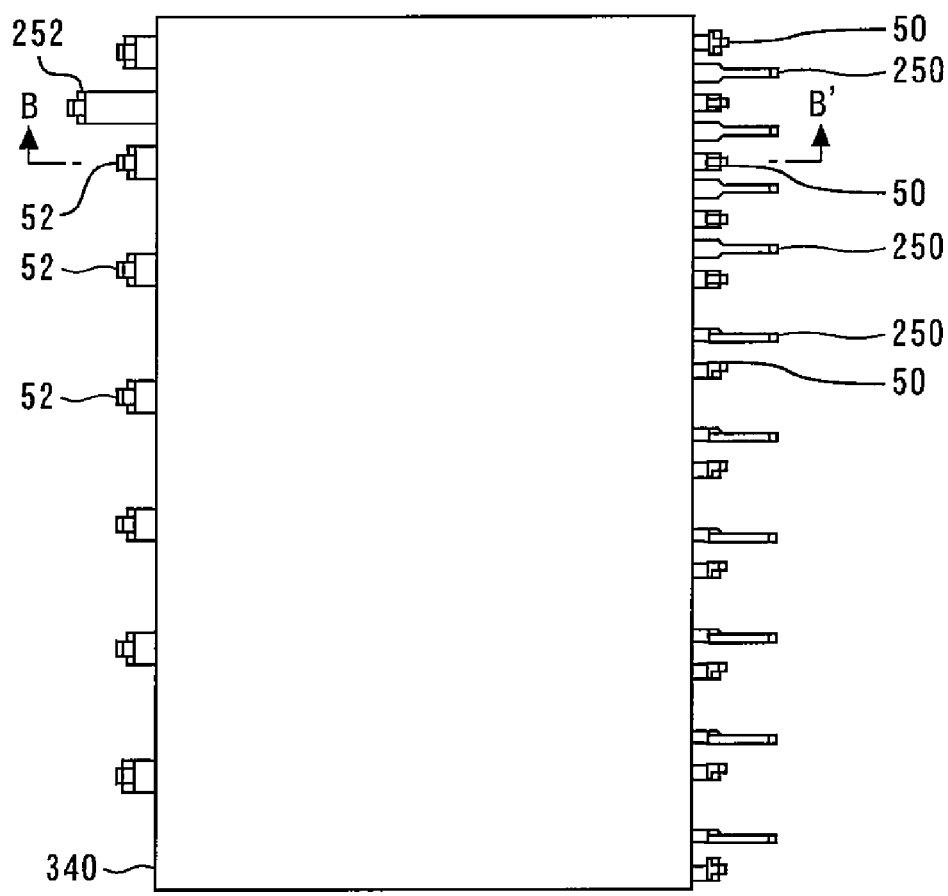
FIG. 16 is a plan view of the semiconductor device, illustrating two rows of external terminals.
Figure 17A:
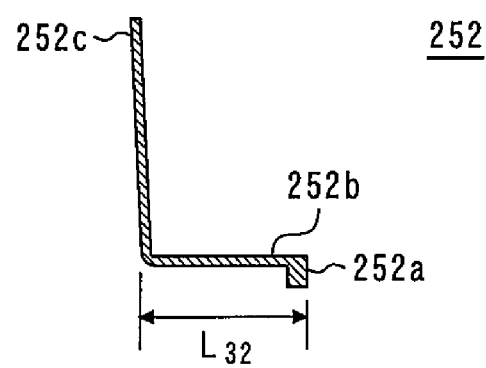
FIGS. 17A to 17D show the configurations of external terminals of the semiconductor device of the third embodiment.
Figure 17B:
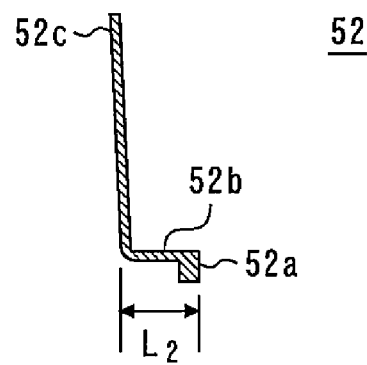
Figure 17C:
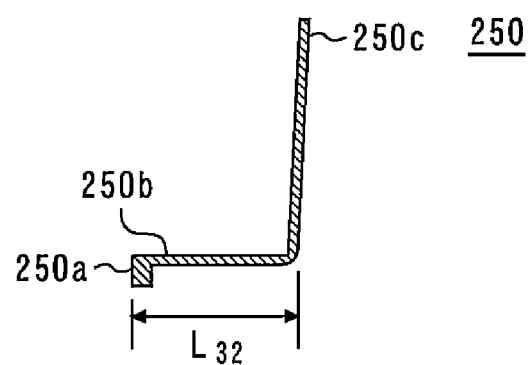
Figure 17D:
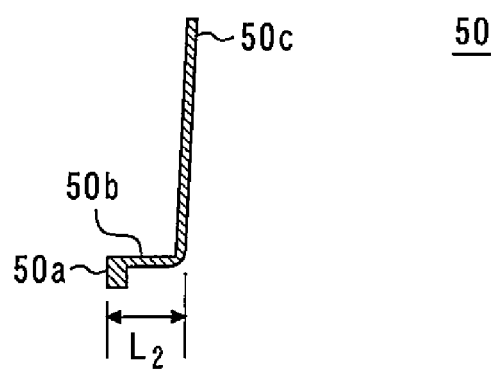

FIG. 15 is a cross-sectional view showing the configuration of a semiconductor device 220 in accordance with a third embodiment of the present invention. FIG. 16 is a plan view of the semiconductor device 220, illustrating two rows of external terminals. Specifically, FIG. 15 is a cross-sectional view of the semiconductor device 220 taken along line B-B' of FIG. 16 and viewed in the direction of the arrows. FIGS. 17A to 17D show the configurations of external terminals 50, 52, 250, and 252 of the semiconductor device 220 of the third embodiment.

The semiconductor device 220 of the third embodiment includes a functional block unit 330 and an external resin sealing body 340. The functional block unit 330 and the external resin sealing body 340 correspond to the functional block unit 30 and the external resin sealing body 40, respectively, of the semiconductor device 10 of the first embodiment (or the semiconductor device 120 of the second embodiment). The semiconductor device 220 of the third embodiment differs from the semiconductor devices 10 and 120 in that it includes the external terminals 250 and 252 in addition to the external terminal 50 and 52. It should be noted that the method of manufacturing the semiconductor device 220 in accordance with the third embodiment is similar to the manufacturing method of the first embodiment illustrated in FIG. 7.

The functional block unit 330 includes internal components, such as semiconductor elements, and an internal resin sealing body 330a. Specifically, these internal components are transfer molded with a resin, which forms the internal resin sealing body 330a. The internal components include an insulating sheet 321, a die pad 322, internal terminals 323, internal terminals 324, semiconductor elements 25 and 26, control ICs 27, and wires 328a, 328b, 328c, 328d, and 328e. The semiconductor elements 25 and 26 are die bonded to the top surface of the die pad 322. The insulating sheet 321, which has high thermal conductivity, is disposed on the bottom surface of the die pad 322. Though not shown, a heat sink 2 is attached to the lower surface side of the functional block unit 330, as in the first and second embodiments.

As shown in FIG. 16, the internal resin sealing body 330a of the functional block unit 330 has a longitudinal edge 333a and an opposing longitudinal edge 333b. A row of alternating external terminals 50 and external terminals 250 are provided on the edge 333a side of the functional block unit 330. Further, a row of external terminals 52 and one external terminal 252 are provided on the edge 333b side of the functional block unit 330. The edge 333a of the internal resin sealing body 330a (or functional block unit 330) has a step 334a, which corresponds to the step 34a of the internal resin sealing body 30a of the first embodiment. Further, the edge 333b of the internal resin sealing body 330a has a step 334b, which corresponds to the step 34b of the internal resin sealing body 30a of the first embodiment. The internal terminals 323 project from the upper vertical face of the edge 333a of the internal resin sealing body 330a and extend over the step 334a. Each external terminal 50, 250 is connected to the surface of a respective internal terminal 323 by solder 60. Likewise, the internal terminals 324 project from the upper vertical face of the edge 333b of the internal resin sealing body 330a and extend over the step 334b. Each external terminal 52, 252 is connected to the surface of a respective internal terminal 324 by solder 60. It should be noted that the lower portion of the edge 333a of the internal resin sealing body 330a (or functional block unit 330) has a cutout portion 335a, and the lower portion of the edge 333b has a cutout portion 335b.

As can be seen from FIGS. 15 and 17A to 17D, the length L32 of the middle portion 250b of each external terminal 250 is different from the length L2 of the middle portion 50b of each external terminal 50. Likewise, the length L32 of the middle portion 252b of each external terminal 252 is different from the length L2 of the middle portion 52b of each external terminal 52.

This means that the alternating external terminals 50 and external terminals 250 project different distances from the edge 333a side of the semiconductor device 220 (which is referred to herein as a staggered terminal arrangement), and the external terminals 52 and 252 project different distances from the edge 333b side, as shown in FIG. 16. Since the external terminals 50, 52, 250, and 252 are separate components, they can be designed with great freedom. This facilitates the desired design of the circuit pattern of the control substrate into which the semiconductor device 220 is inserted.

Advantages of the present embodiment will be specifically described. For example, in the case of an inverter control substrate using an IPM encapsulated in a DIP package, a large current flows through the power side GND terminals (three shunt conductors) of the IPM. Therefore, the line width must be relatively large. Further, since a high voltage (600 V or so) is applied to the lines adjacent the control side BSD terminal, sufficient clearance must be provided between these lines. If the external terminals of the IPM project equal distances from its sides (which is referred to herein as a straight terminal arrangement), as in the first and second embodiments, the distance between the GND terminals is small, as compared to when the external terminals are in a staggered terminal arrangement. This makes it difficult to design a circuit pattern having a sufficient line width. Further, if the IPM has a straight external terminal arrangement, it is difficult to form a circuit pattern having sufficient clearance between the high voltage lines, since the control terminals are spaced a relatively short distance from each other. If, on the other hand, the IPM has a staggered external terminal arrangement, it is easy to design such a circuit pattern on the control substrate.

In the case where inner leads and outer leads of the lead frame of a semiconductor device serve as the internal terminals and the external terminals of the semiconductor device, the length of these external terminals is limited due to manufacturing restrictions, making it difficult to achieve a staggered external terminal arrangement. Specifically, such manufacturing restrictions include restrictions on the transfer reel width of the die bonding apparatus and on the dimensions of the molding die. The semiconductor device 220 of the present embodiment, on the other hand, can be configured to have the desired staggered external terminal arrangement by varying the lengths of portions of the external terminals 50, 52, 250, and 252 and the angle θ1 between the middle portion and the terminal portion of each external terminal, since the external terminals 50, 52, 250, and 252 are separate components.

It should be noted that in the semiconductor device 220 of the third embodiment, at least one of the external terminals 50, 52, 250, and 252 may have a projection similar to the projections 150e and 152e of the external terminals 150 and 152, respectively, of the semiconductor device 120 of the second embodiment.

The features and advantages of the present invention may be summarized as follows.

Thus the present invention provides a semiconductor device and a method of manufacturing a semiconductor device wherein the external terminals of the semiconductor device are separate components and these external terminals and the functional block unit of the semiconductor device are packaged together using an external resin sealing body, thus providing great freedom in designing the configuration of the external terminals.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2013-012365, filed on Jan. 25, 2013 including specification, claims, drawings and summary, on which the Convention priority of the present application is based, are incorporated herein by reference in its entirety.

The invention claimed is:

1. A method of manufacturing a semiconductor device, comprising:

a functional block preparation step of preparing a functional block unit, wherein the functional block unit includes a semiconductor element, at least one internal terminal having a first end and a second end and electrically connected to the semiconductor element, and an internal resin sealing body covering the semiconductor element and the first end of the at least one internal terminal but not covering the second end of the at least one internal terminal;

an external terminal preparation step of preparing an external terminal having a third end and a fourth end;

a connection step of connecting the third end of the external terminal to the second end of the at least one internal terminal; and an external resin sealing step of, after the connection step, covering the second end of the at least one internal terminal and the third end of the external terminal with a resin, but not covering the fourth end of the external terminal, wherein:

the internal resin sealing body has an upper surface facing in a first direction, an opposite lower surface, and an edge extending between the upper and lower surfaces; and the external terminal has a root portion extending in the first direction from the third end connected to the second end of the at least one internal terminal, a middle portion extending perpendicularly or obliquely from the root portion in a direction outwardly away from the edge of the internal resin sealing body, and a terminal portion extending perpendicularly or obliquely from the middle portion in the first direction and having the fourth end.

2. The method according to claim 1, wherein the external terminal preparation step includes the step of forming the root portion, the middle portion, and the terminal portion of the external terminal by means of punching.

* * * * *